(12) United States Patent
Wang et al.

(10) Patent No.: US 8,058,665 B2
(45) Date of Patent: Nov. 15, 2011

(54) LED MODULE

(75) Inventors: Zhong-Qing Wang, Shenzhen (CN);
Hai-Wei Zhang, Shenzhen (CN)

(73) Assignees: Fu-Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 153 days.

(21) Appl. No.: 12/566,696

(22) Filed: Sep. 25, 2009

(65) Prior Publication Data

US 2010/0327302 A1   Dec. 30, 2010

(30) Foreign Application Priority Data

Jun. 30, 2009   (CN) .......................... 2009 1 0303873

(51) Int. Cl.
*H01L 33/00* (2010.01)
(52) U.S. Cl. .......... 257/98; 362/326; 362/310; 362/335; D26/2
(58) Field of Classification Search ................. 362/326, 362/310, 335; 257/98; D26/2
See application file for complete search history.

(56) References Cited

U.S. PATENT DOCUMENTS

2004/0120135 A1* 6/2004 Tenmyo ......................... 362/16
2006/0193137 A1* 8/2006 Chinniah et al. ............... 362/326

* cited by examiner

*Primary Examiner* — Matthew Reames
(74) *Attorney, Agent, or Firm* — Altis Law Group, Inc.

(57) ABSTRACT

An LED module includes an LED and a lens located over and enclosing the LED. The lens includes a surface of incidence facing the LED for an incidence of light emitted from the LED and a surface of emission for an emission of the light out of the LED module. The surface of incidence has a convex spherical surface, and the surface of emission has a concave spherical surface corresponding to the convex spherical surface. The convex spherical surface refracts the light incident thereon to redirect the light to the concave spherical surface. The concave spherical surface spreads the light into a wide and uniform beam. The surface of emission further has a first cylinder extending downwardly from an outer edge of the concave spherical surface. A totally reflective coincoid extends downwards from the first cylinder to a bottom of the LED module.

20 Claims, 4 Drawing Sheets

LED MODULE

BACKGROUND

1. Technical Field

The disclosure relates to a light-emitting device and, more particularly, to an LED (light emitting diode) module.

2. Description of Related Art

LEDs (light emitting diodes), available since the early 1960's, have been increasingly used in a variety of application fields and are intended to be a high quality replacement for conventional light sources due to high light-emitting efficiency, environmental friendliness, and low power consumption.

A typical LED includes an LED die emitting light and a transparent encapsulant enveloping the LED die. The encapsulant protects the LED die from contamination and damage, and converges most of the light emitted from the LED die around an optical axis of the LED into a narrow beam. The encapsulant keeps a peak intensity of the light occurring around the optical axis of the LED, which easily results in a discomfortable glare.

What is needed, therefore, is an LED module which can overcome the above-mentioned problem.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
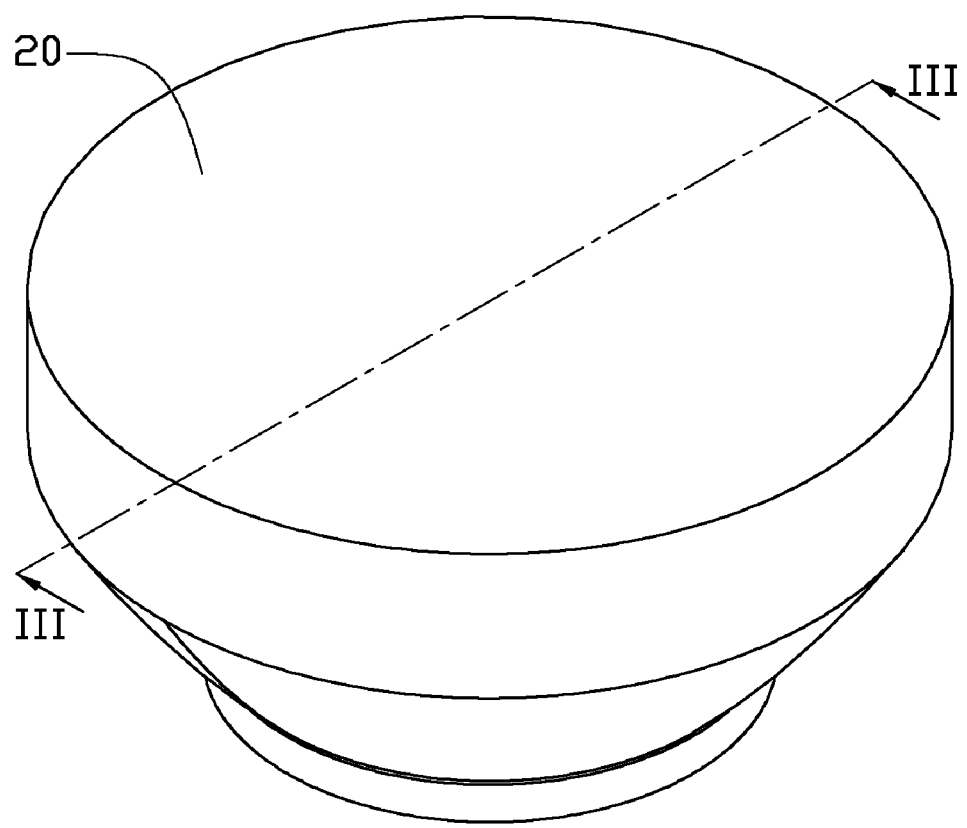
FIG. 1 is an isometric, assembled view of an LED module in accordance with an embodiment of the disclosure.
Figure 3:
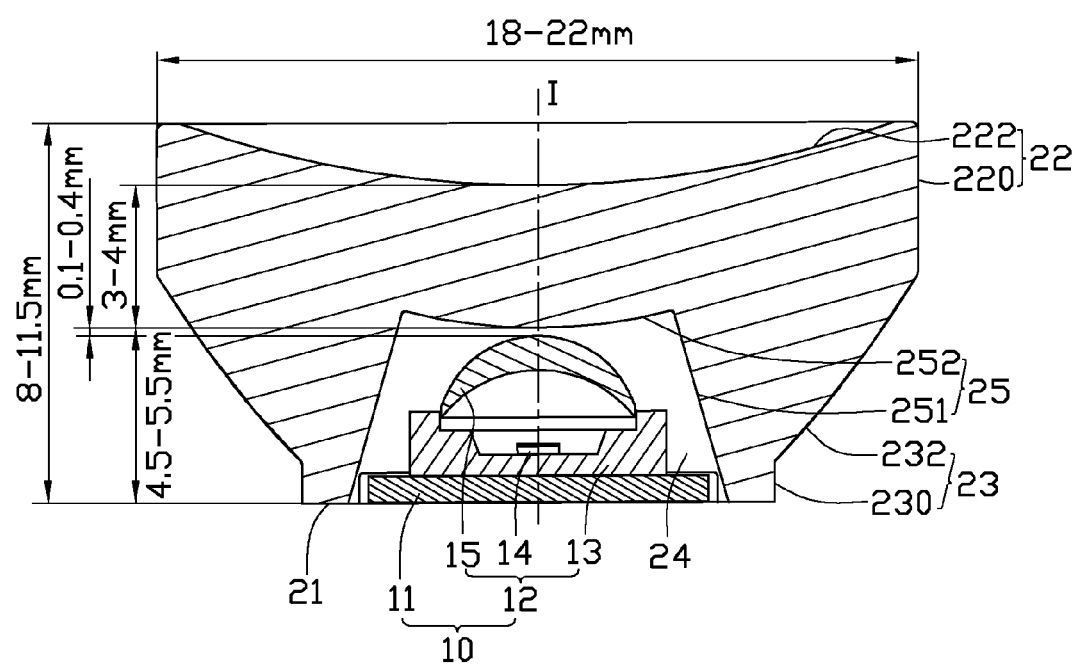
FIG. 3 is a cross-section of the LED module of FIG. 1, taken along a line thereof.

Referring to FIGS. 1 and 3, an LED (light emitting diode) module is illustrated in accordance with an embodiment of the disclosure. The LED module includes an LED assembly 10 (see FIG. 3) and a lens 20 located over and enclosing the LED assembly 10. The LED assembly 10 includes a plate-shaped printed circuit board 11 and an LED 12 attached to a top surface of the printed circuit board 11. The LED 12 has a vertical optical axis I. The LED 12 includes a rectangular base 13 having a recess (not labeled) recessed downwards from a top surface thereof, an LED die 14 secured in the recess of the base 13 and an encapsulant 15 enveloping the LED die 14 and fixed on a top of the base 13. The encapsulant 15 is dome-shaped for being acted as a primary convex lens to spread light emitted from the LED die 14 into a divergent pattern.

Figure 2:
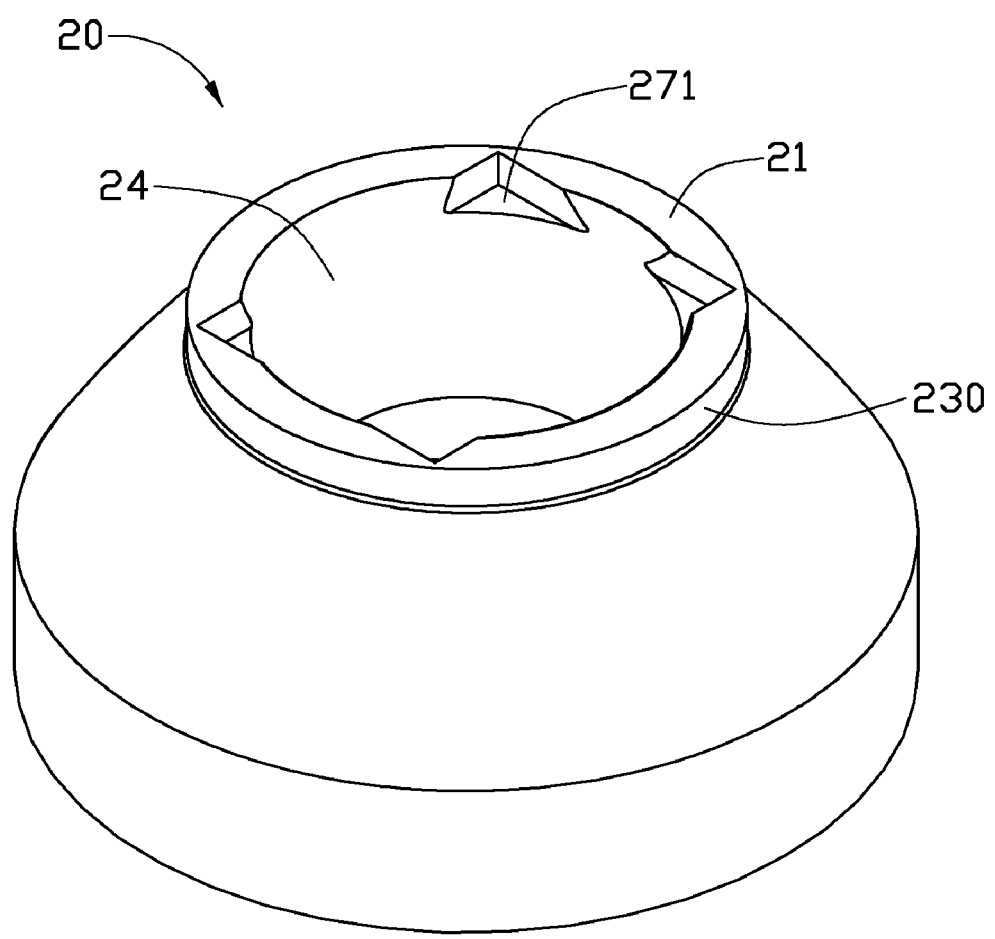
FIG. 2 is an inverted view of FIG. 1 with an LED removed from the LED module for clarity.

Also referring to FIG. 2, the lens 20 may be integrally made of a light-permeable material, such as PC or PMMA. The lens 20 has a bowl-like configuration. The lens 20 includes a circular bottom surface 21 (see FIG. 2), a surface of emission 22 located over and spaced from the bottom surface 21, and an annulus 23 which extends from the bottom surface 21 towards the surface of emission 22 and connects them together. A groove 24 is recessed upwardly from a center of the bottom surface 21 for receiving the LED assembly 10 therein. The groove 24 has a surface of incidence 25 facing the LED 12 for an incidence of light emitted from the LED 12. The surface of emission 22 is located over the surface of incidence 25, through which light of the LED module which is generated by the LED 12 emits to lighten an intended object.

The surface of emission 22 includes a first vertical cylinder 220 and a concave spherical surface 222 concaved from a top edge of the first cylinder 220 to an inner space of the first cylinder 220. The first cylinder 220 has a diameter of 18 mm to 22 mm. A center axis (not labeled) of the first cylinder 220 coincides with the optical axis I of the LED 12. A center of curvature of the concave spherical surface 222 is on the optical axis I of the LED 12. The concave spherical surface 222 is symmetric to the optical axis I of the LED 12.

The annulus 23 includes a second vertical cylinder 230 extending upwardly from a periphery edge of the bottom surface 21 and a conicoid 232 extending upwardly from a top of the second cylinder 230 towards the first cylinder 220 to thereby connect the first cylinder 220 with the second cylinder 230. The second cylinder 230 has a height slightly larger than a thickness of the printed circuit board 11 of the LED assembly 10, but smaller than that of the first cylinder 220. The diameter of the first cylinder 220 is larger than that of the second cylinder 230, whereby the conicoid 232 is progressively wider from the second cylinder 230 towards the first cylinder 220. A conic constant of the conicoid 232 is larger than or equal to −1. Preferably, the conic constant of the conicoid 232 is equal to −1.

The surface of incidence 25 includes a circumferential surface 251 and a convex spherical surface 252 located at a top end of the circumferential surface 251. The circumferential surface 251 is configured as a conical frustum or segment forming a small opening at the top end thereof and a large opening at a bottom end thereof. The convex spherical surface 252 has a center portion thereof extending inwardly into an inner space of the circumferential surface 251 of the conical frustum or segment. A center axis of the circumferential surface 251 of the conical frustum or segment coincides with the optical axis I of the LED 12. The circumferential surface 251 has a taper of 12° to 20°. A center of curvature of the convex spherical surface 252 is on the optical axis I of the LED 12. The convex spherical surface 252 is symmetric to the optical axis I of the LED 12. A radius of curvature of the concave spherical surface 222 is 1.5 to 2.5 times of that of the convex spherical surface 252. A vertical distance between two intersecting points of the convex spherical surface 252 and the concave spherical surface 222 respectively intersecting with the optical axis I of the LED 12 is controlled within a range of 3 mm to 4 mm. A vertical distance between the intersecting point of the convex spherical surface 252 with the optical axis I of the LED 12 and a peak of the encapsulant 15 of the LED 12 is kept within a range of 0.1 mm to 0.4 mm. A vertical distance between the intersecting point of the convex spherical surface 252 intersecting with the optical axis I of the LED 12 and the bottom surface 21 is kept within a range of 4.5 mm to 5.5 mm. A height of the lens 20 is controlled within a range of 8 mm to 11.5 mm.

The lens 20 defines four triangular cutouts 271 in the bottom surface 21, around and communicating with the groove 24, cooperatively defining a rectangular space (not labeled). The cutouts 271 each have a depth equal to the thickness of the printed circuit board 11 of the LED assembly 10 for receiving the printed circuit board 11 in the rectangular space.

Figure 4:
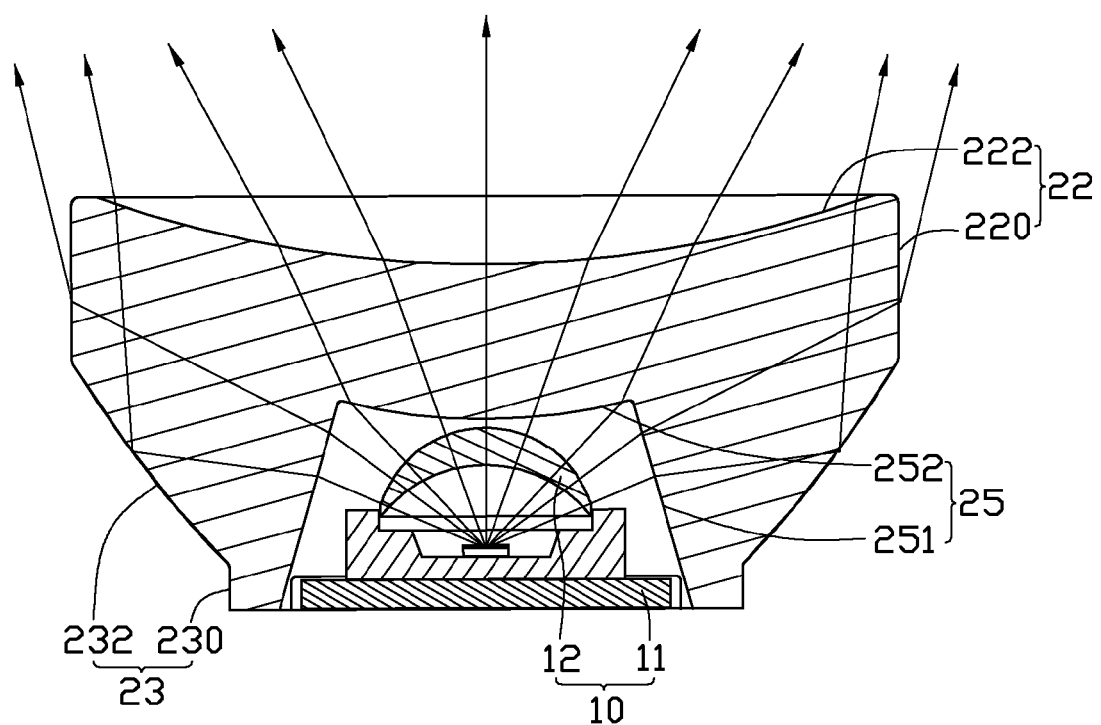
FIG. 4 is a schematic view of the optical property of the LED module of FIG. 3.

Also referring to FIG. 4, the light emitted from the LED 12 is incident on the surface of incidence 25. The light incident on the convex spherical surface 252 of the surface of incidence 25 is refracted to be totally incident on the concave spherical surface 222 of the surface of emission 22, and then is refracted by the concave spherical surface 222 into a wide and uniform beam at a center portion of the concave spherical surface 222, uniformly illuminating a round illumination region.

The light incident on the circumferential surface 251 of the conical frustum or segment of the surface of incidence 25 is refracted to be incident on the conicoid 232 of the annulus 23 and the first vertical cylinder 220 of the surface of emission 22. The light incident on the conicoid 232 is totally reflected to be incident on a periphery of the concave spherical surface 222, and then is refracted by the concave spherical surface 222 at a small angle with respect to the optical axis I of the LED 12. The light incident on the first vertical cylinder 220 is refracted out of the surface of emission 22 at a small angle with respect to the optical axis I of the LED 12. The light incident on the circumferential surface 251 of the conical frustum or segment is converged into an annular narrow beam of relatively high intensity near the periphery of the concave spherical surface 222 by the total reflection of the conicoid 232 and the refractions of the concave spherical surface 222 and the first vertical cylinder 220. The annular narrow beam near the periphery of the concave spherical surface 222 and the wide uniform beam at the center portion of the concave spherical surface 222 cooperatively form a wider beam within 45-90 degrees off the optical axis I of the LED 12, whereby a light-extracting efficiency of the LED module is raised to nearly 90%.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED module comprising:
    an LED having an optical axis; and
    a lens located over and enclosing the LED, the lens comprising a surface of incidence facing the LED for an incidence of light emitted from the LED and a surface of emission located over the surface of incidence for an emission of the light emitted from the LED therethrough, the surface of incidence comprising a convex spherical surface, and the surface of emission comprising a concave spherical surface corresponding to the convex spherical surface;
    wherein the convex spherical surface refracts the light incident thereon to redirect the light to radiate on the concave spherical surface, through the concave spherical surface the light leaving the LED module as a wide and uniform beam, and a radius of curvature of the concave spherical surface is 1.5 to 2.5 times of that of the convex spherical surface.

2. The LED module as claimed in claim 1, wherein a height of the lens is controlled within a range of 8 mm to 11.5 mm.

3. The LED module as claimed in claim 1, wherein the LED comprises an encapsulant facing the convex spherical surface of the surface of incidence, a vertical distance between an intersecting point of the convex spherical surface with the optical axis of the LED and a peak of the encapsulant being kept within a range of 0.1 mm to 0.4 mm.

4. The LED module as claimed in claim 1, wherein the concave spherical surface is symmetric to the optical axis of the LED, the convex spherical surface being symmetric to the optical axis of the LED.

5. The LED module as claimed in claim 1, wherein a vertical distance between two intersecting points of the convex spherical surface and the concave spherical surface respectively intersecting with the optical axis of the LED is controlled within a range of 3 mm to 4 mm.

6. The LED module as claimed in claim 1, wherein the surface of emission further comprises a first cylinder extending from a periphery edge of the concave spherical surface, a center axis of the first cylinder coinciding with the optical axis of the LED.

7. The LED module as claimed in claim 6, wherein the first cylinder of the surface of emission has a diameter of 18-22 mm.

8. The LED module as claimed in claim 6, wherein the lens further comprises a bottom surface, a second cylinder extending upwardly from the bottom surface and a conicoid connecting the second cylinder with the first cylinder of the surface of emission, the conicoid being a totally reflective surface and being progressively wider from the second cylinder towards the first cylinder.

9. The LED module as claimed in claim 8, wherein a conic constant of the conicoid is no less than −1.

10. The LED module as claimed in claim 9, wherein the conic constant of the conicoid is equal to −1.

11. The LED module as claimed in claim 8, wherein a groove is recessed upwardly from a center of the bottom surface for receiving the LED therein, a top surface of the groove forming the convex spherical surface and a side surface of the groove forming a circumferential surface of a conical frustum.

12. The LED module as claimed in claim 11, wherein the circumferential surface of the conical frustum is progressively wider from the convex spherical surface towards the bottom surface.

13. The LED module as claimed in claim 12, wherein the circumferential surface of the conical frustum has a taper of 12° to 20°.

14. An LED module comprising:
    an LED having an optical axis; and
    a lens located over and enclosing the LED, the lens comprising a surface of incidence facing the LED for an incidence of light emitted from the LED and a surface of emission located over the surface of incidence for an emission of the light emitted from the LED therethrough, the surface of incidence comprising a convex spherical surface, and the surface of emission comprising a concave spherical surface corresponding to the convex spherical surface;
    wherein the convex spherical surface refracts the light incident thereon to redirect the light to radiate on the concave spherical surface, through the concave spherical surface the light leaving the LED module as a wide and uniform beam, and a vertical distance between two intersecting points of the convex spherical surface and the concave spherical surface respectively intersecting with the optical axis of the LED is controlled within a range of 3 mm to 4 mm.

15. The LED module as claimed in claim 14, wherein a height of the lens is controlled within a range of 8 mm to 11.5 mm.

16. The LED module as claimed in claim 14, wherein the LED comprises an encapsulant facing the convex spherical surface of the surface of incidence, a vertical distance between an intersecting point of the convex spherical surface with the optical axis of the LED and a peak of the encapsulant being kept within a range of 0.1 mm to 0.4 mm.

17. The LED module as claimed in claim 14, wherein the concave spherical surface is symmetric to the optical axis of the LED, the convex spherical surface being symmetric to the optical axis of the LED.

18. The LED module as claimed in claim 14, wherein the surface of emission further comprises a first cylinder extending from a periphery edge of the concave spherical surface, a center axis of the first cylinder coinciding with the optical axis of the LED.

19. The LED module as claimed in claim 18, wherein the lens further comprises a bottom surface, a second cylinder extending upwardly from the bottom surface and a conicoid connecting the second cylinder with the first cylinder of the surface of emission, the conicoid being a totally reflective surface and being progressively wider from the second cylinder towards the first cylinder.

20. An LED module comprising:
 an LED having an optical axis; and
 a lens located over and enclosing the LED, the lens comprising a surface of incidence facing the LED for an incidence of light emitted from the LED and a surface of emission located over the surface of incidence for an emission of the light emitted from the LED therethrough, the surface of incidence comprising a convex spherical surface, and the surface of emission comprising a concave spherical surface corresponding to the convex spherical surface;
 wherein the convex spherical surface refracts the light incident thereon to redirect the light to radiate on the concave spherical surface, through the concave spherical surface the light leaving the LED module as a wide and uniform beam;
 wherein the surface of emission further comprises a first cylinder extending from a periphery edge of the concave spherical surface, a center axis of the first cylinder coinciding with the optical axis of the LED; and
 wherein the lens further comprises a bottom surface, a second cylinder extending upwardly from the bottom surface and a conicoid connecting the second cylinder with the first cylinder of the surface of emission, the conicoid being a totally reflective surface and being progressively wider from the second cylinder towards the first cylinder.

* * * * *